US012283555B2

United States Patent
Bayrakci et al.

(10) Patent No.: US 12,283,555 B2
(45) Date of Patent: Apr. 22, 2025

(54) SEMICONDUCTOR PACKAGES

(71) Applicant: Analog Devices International Unlimited Company, Limerick (IE)

(72) Inventors: Bilge Bayrakci, Istanbul (TR); Abdullah Celik, Istanbul (TR); Winslow Round, Amesbury, MA (US); Santosh Anil Kudtarkar, Ayer, MA (US); Yusuf Atesal, Istanbul (TR); Turusan Kolcuoglu, Arlington, MA (US)

(73) Assignee: Analog Devices International Unlimited Company, Co. Limerick (IE)

( * ) Notice: Subject to any disclaimer, the term of this patent is extended or adjusted under 35 U.S.C. 154(b) by 0 days.

(21) Appl. No.: 16/058,922

(22) Filed: Aug. 8, 2018

(65) Prior Publication Data

US 2019/0295968 A1 Sep. 26, 2019

Related U.S. Application Data

(60) Provisional application No. 62/647,549, filed on Mar. 23, 2018.

(51) Int. Cl.
*H01L 23/66* (2006.01)
*H01L 23/00* (2006.01)
(Continued)

(52) U.S. Cl.
CPC ............ *H01L 23/66* (2013.01); *H01L 23/147* (2013.01); *H01L 23/3128* (2013.01);
(Continued)

(58) Field of Classification Search
CPC . H01L 21/486; H01L 21/563; H01L 21/4857; H01L 23/49827; H01L 23/5384;
(Continued)

(56) References Cited

U.S. PATENT DOCUMENTS 3,840,889 A 10/1974 O'Brien et al.
5,019,673 A 5/1991 Juskey et al.
(Continued)

FOREIGN PATENT DOCUMENTS

CN 1331494 A 1/2002
CN 102640369 A 8/2012
(Continued)

OTHER PUBLICATIONS

Peterson, Zachariah, "Overview of Heat Sink Design Basics and Principles", https://resources.altium.com/p/overview-of-heat-sink-design-basics-and-principles, Jun. 13, 2017 (Year: 2017).*
(Continued)

*Primary Examiner* — Vincent Wall
(74) *Attorney, Agent, or Firm* — KNOBBE, MARTENS, OLSON & BEAR, LLP

(57) ABSTRACT

A package is disclosed. The package includes a carrier that comprises a first conductive layer on a first side and a second conductive layer on a second side opposite the first side. The first conductive layer comprises wire bonding pads. The package also includes a semiconductor die that is flip chip mounted on the first side of the carrier.

13 Claims, 8 Drawing Sheets

(51) Int. Cl.
  *H01L 23/14*    (2006.01)
  *H01L 23/31*    (2006.01)
  *H01L 23/498*   (2006.01)
  *H01L 25/065*   (2023.01)
  *H05K 1/02*     (2006.01)
  *H05K 1/18*     (2006.01)
  *H05K 3/32*     (2006.01)

(52) U.S. Cl.
  CPC .. *H01L 23/49811* (2013.01); *H01L 23/49827* (2013.01); *H01L 23/49838* (2013.01); *H01L 24/06* (2013.01); *H01L 24/13* (2013.01); *H01L 24/16* (2013.01); *H01L 24/37* (2013.01); *H01L 24/45* (2013.01); *H01L 25/0657* (2013.01); *H05K 1/0243* (2013.01); *H05K 1/183* (2013.01); *H05K 3/321* (2013.01); *H01L 23/49822* (2013.01); *H01L 24/05* (2013.01); *H01L 24/32* (2013.01); *H01L 24/40* (2013.01); *H01L 24/48* (2013.01); *H01L 24/73* (2013.01); *H01L 2223/6611* (2013.01); *H01L 2223/6616* (2013.01); *H01L 2224/05553* (2013.01); *H01L 2224/0557* (2013.01); *H01L 2224/06181* (2013.01); *H01L 2224/131* (2013.01); *H01L 2224/13147* (2013.01); *H01L 2224/16145* (2013.01); *H01L 2224/16146* (2013.01); *H01L 2224/16148* (2013.01); *H01L 2224/16157* (2013.01); *H01L 2224/16227* (2013.01); *H01L 2224/16235* (2013.01); *H01L 2224/2929* (2013.01); *H01L 2224/293* (2013.01); *H01L 2224/40227* (2013.01); *H01L 2224/45014* (2013.01); *H01L 2224/45015* (2013.01); *H01L 2224/45144* (2013.01); *H01L 2224/48227* (2013.01); *H01L 2224/48465* (2013.01); *H01L 2224/48472* (2013.01); *H01L 2224/73204* (2013.01); *H01L 2224/73207* (2013.01); *H01L 2224/73215* (2013.01); *H01L 2224/73253* (2013.01); *H01L 2224/83104* (2013.01); *H01L 2224/92125* (2013.01); *H01L 2225/06513* (2013.01); *H01L 2225/06541* (2013.01); *H01L 2924/10329* (2013.01); *H01L 2924/15153* (2013.01); *H01L 2924/181* (2013.01); *H01L 2924/19107* (2013.01); *H05K 3/32* (2013.01)

(58) Field of Classification Search
  CPC ........... H01L 23/49811; H01L 23/3128; H01L 23/49822; H01L 23/49838; H01L 23/5383; H01L 23/5386; H01L 23/49531; H01L 23/4852; H01L 2224/73204
  See application file for complete search history.

(56) References Cited

U.S. PATENT DOCUMENTS

| | | | |
|---|---|---|---|
| 5,610,442 A * | 3/1997 | Schneider | H01L 23/3128 |
| | | | 257/706 |
| 5,615,477 A | 4/1997 | Sweitzer | |
| 5,758,413 A | 6/1998 | Chong et al. | |
| 5,768,109 A | 6/1998 | Gulick et al. | |
| 6,130,483 A | 10/2000 | Shizuki et al. | |
| 6,191,487 B1 | 2/2001 | Rodenbeck et al. | |
| 6,219,254 B1 | 4/2001 | Akerling et al. | |
| 6,507,594 B1 | 1/2003 | Furukawa et al. | |
| 6,611,055 B1 | 8/2003 | Hashemi | |
| 6,757,309 B1 | 6/2004 | Karpinski | |
| 6,987,058 B2 | 1/2006 | Hall | |
| 6,992,384 B2 | 1/2006 | Joshi | |
| 7,061,949 B1 | 6/2006 | Zhou et al. | |
| 7,157,799 B2 | 1/2007 | Noquil et al. | |
| 7,385,229 B2 | 6/2008 | Venugopalan | |
| 7,666,711 B2 | 2/2010 | Pagaila et al. | |
| 7,704,796 B2 | 4/2010 | Pagaila et al. | |
| 8,059,057 B2 | 11/2011 | Mason et al. | |
| 8,097,490 B1 | 1/2012 | Pagaila et al. | |
| 8,168,458 B2 | 5/2012 | Do et al. | |
| 8,435,835 B2 | 5/2013 | Pagaila et al. | |
| 8,848,757 B2 | 9/2014 | Joseph | |
| 8,888,331 B2 | 11/2014 | Mandelboum et al. | |
| 9,082,806 B2 | 7/2015 | Lin et al. | |
| 9,086,275 B2 | 7/2015 | Weinberg et al. | |
| 9,337,116 B2 | 5/2016 | Pagaila et al. | |
| 9,443,828 B2 | 9/2016 | Pagaila et al. | |
| 9,780,057 B2 | 10/2017 | Pendse | |
| 10,459,157 B2 | 10/2019 | Chojnacki et al. | |
| 2004/0130037 A1 | 7/2004 | Mishra et al. | |
| 2004/0232982 A1 | 11/2004 | Ichitsubo et al. | |
| 2005/0047455 A1 | 3/2005 | Tanaka et al. | |
| 2005/0074046 A1 | 4/2005 | Kasai | |
| 2005/0103522 A1 | 5/2005 | Grundy et al. | |
| 2007/0040735 A1 * | 2/2007 | Matsuo | H01L 23/552 |
| | | | 342/175 |
| 2008/0164573 A1 | 7/2008 | Basker et al. | |
| 2011/0267789 A1 | 11/2011 | Chew et al. | |
| 2012/0049334 A1 | 3/2012 | Pagaila et al. | |
| 2012/0062439 A1 | 3/2012 | Liao et al. | |
| 2012/0146177 A1 | 6/2012 | Choi et al. | |
| 2014/0127858 A1 | 5/2014 | Shim et al. | |
| 2016/0035680 A1 | 2/2016 | Wu | |
| 2016/0148891 A1 * | 5/2016 | Tsao | H01L 23/49827 |
| | | | 257/737 |
| 2016/0163610 A1 * | 6/2016 | Podval | H05K 1/117 |
| | | | 174/252 |
| 2016/0351463 A1 | 12/2016 | Chen et al. | |
| 2016/0372387 A1 | 12/2016 | Moffat et al. | |
| 2017/0026071 A1 | 1/2017 | Young | |
| 2017/0034913 A1 | 2/2017 | Mu et al. | |
| 2017/0064824 A1 | 3/2017 | Kim et al. | |
| 2017/0301653 A1 | 10/2017 | Frenette et al. | |
| 2018/0019192 A1 * | 1/2018 | Chen | H01L 23/3121 |
| 2019/0051591 A1 * | 2/2019 | Kabir | H01L 23/147 |

FOREIGN PATENT DOCUMENTS

| | | |
|---|---|---|
| CN | 203326357 U | 12/2013 |
| CN | 103796421 A | 5/2014 |
| CN | 103891065 A | 6/2014 |
| CN | 105378930 A | 3/2016 |
| CN | 105789163 A | 7/2016 |
| CN | 105793979 A | 7/2016 |
| CN | 106921357 A | 7/2017 |
| CN | 107732651 A | 2/2018 |
| CN | 113272953 A | 8/2021 |
| DE | 4036896 C1 | 2/1992 |
| DE | 20 2006005148 U1 | 8/2007 |
| DE | 10 2011116534 A1 | 4/2013 |
| DE | 10 2014223342 A1 | 5/2015 |
| EP | 1729340 A1 | 12/2006 |
| JP | H 08274248 | 10/1996 |
| JP | 2000-164970 A | 6/2000 |
| JP | 2004-103870 A | 4/2004 |
| JP | 2007266539 A | 10/2007 |
| KR | 20080068299 | 7/2008 |
| TW | 200839990 A | 10/2008 |
| TW | 200921768 A | 5/2009 |
| TW | I429031 B | 3/2014 |
| TW | 201642412 A | 12/2016 |
| TW | I785515 B | 12/2022 |
| WO | WO 2008/110533 A2 | 9/2008 |
| WO | WO 2017/140737 A1 | 8/2017 |

OTHER PUBLICATIONS

International Search Report and Written Opinion issued in application No. PCT/EP2019/055705 on Jul. 30, 2019 in 22 pages.
Analog Devices, "HMC941A, v02.0817, 0.5 dB LCB GaAs MMIC 5-Bit Digital Attentuator, 0.1-30 GHZ," in 6 pages.

(56) References Cited

OTHER PUBLICATIONS

Taiwanese Office Action in TW 110107268, dated Aug. 3, 2021.
Office Action received in CN 11120167610, dated Feb. 21, 2022.
International Preliminary Report on Patentability in Application No. PCT/EP2019/055705 dated Oct. 8, 2020.
"Ground Plane", Wikipedia, The Free Encyclopedia, Nov. 16, 2013, XP055112247, Retrieved from the internet : URL: http://en.wikipedia.org/w/index.php?title=ground_plane&oldid-581866624.
Office Action received in CN Application 201710683987 dated Feb. 28, 2019.
Office Action received in CN Application 201710683987 dated Aug. 2, 2019.
Office Action received in CN Application 201710683987 dated Jan. 7, 2020.
Office Action received in DE Application 102017118349 dated May 13, 2020.
Office Action received in DE Application 102017118349 dated Sep. 6, 2022.
Office Action received in DE Application 102017118349 dated Jan. 16, 2023.
Office Action received in DE Application 102017118349 dated Apr. 20, 2023.
Office Action received in Korean Application No. 10-2020-7026174 dated Feb. 4, 2023.
Notice of Allowance dated Aug. 28, 2023 in Korean Application No. 10-2020-7026174.
Communication under Rule 164(2)(a) EPC dated May 10, 2023 in European Application No. 19709903.9.
Office Action dated Sep. 13, 2023 in European Application No. 19 709 903.9.
Office Action received in Taiwan Application No. 110107268 on Feb. 21, 2022.
Office Action dated Jun. 25, 2024 in Chinese Application No. 201980021555.5 in 18 pages.
Invitation to Pay Additional Fees issued in application No. PCT/EP2019/055705 on Jun. 3, 2019.

\* cited by examiner

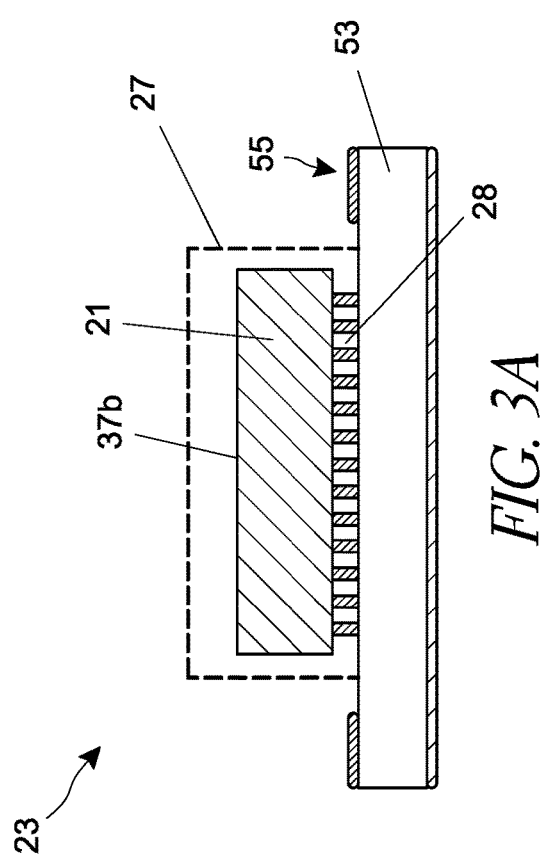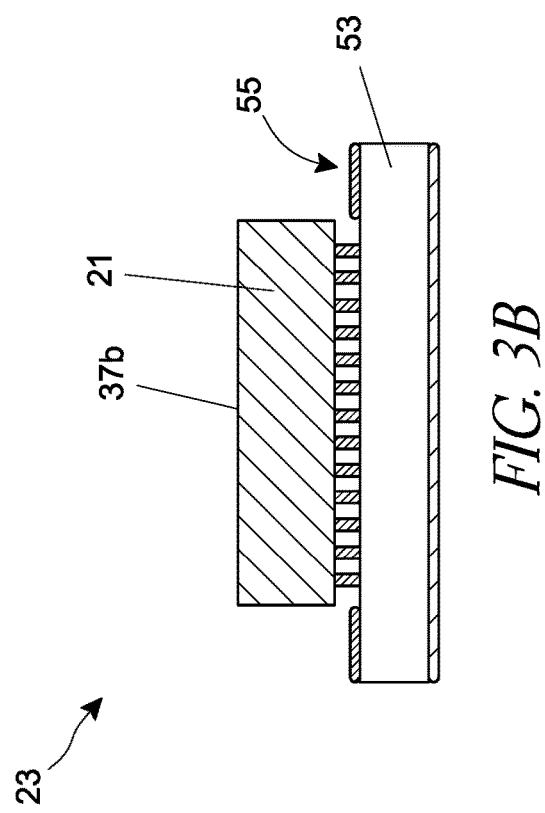

SEMICONDUCTOR PACKAGES

CROSS-REFERENCE TO RELATED APPLICATIONS

This application claims the benefit of U.S. Provisional Application No. 62/647,549 entitled "SEMICONDUCTOR PACKAGES," filed Mar. 23, 2018, the entire disclosure of which is incorporated herein by reference for all purposes.

BACKGROUND

Field

The field relates to semiconductor packages.

Related Art

Attaching a semiconductor die to a board by way of flip-chip bonding calls for expensive alignment and robotic equipment that may not be convenient for the end user. On the other hand, wire bond techniques may not provide adequate performance, particularly for radio frequency (RF) applications in which the semiconductor die processes high frequency signals. Accordingly, there remains a continuing need for improved semiconductor packages.

SUMMARY

In one aspect, a package is disclosed. The package includes a carrier that comprises a first conductive layer on a first side and a second conductive layer on a second side opposite the first side. The first conductive layer has wire bonding pads. The package also includes a semiconductor die that is flip chip mounted on the first side of the carrier.

In one embodiment, the carrier comprises vias from the first side to the second side. The vias can receive electrical ground from the second conductive layer.

In one embodiment, the first conductive layer comprises traces electrically connecting the semiconductor die and the wire bonding pads.

In one embodiment, the semiconductor die is a high frequency radio frequency (RF) die and the first conductive layer carries RF signals.

In one embodiment, the semiconductor die is a silicon-on-insulator (SOI) die.

In one embodiment, the package further includes copper pillars between the semiconductor die and the carrier.

In one embodiment, the package further includes molding material disposed around the semiconductor die.

In one embodiment, the carrier comprises a laminated substrate, a ceramic substrate, or a semiconductor substrate.

In one aspect, an apparatus is disclosed. The apparatus includes a printed circuit board (PCB) that comprises a first conductive layer and a second conductive layer that is separated by dielectric. The first conductive layer is on a first side of the PCB. The PCB includes a recess on the first side and extending through the first conductive layer and the dielectric to the second conductive layer. The apparatus also includes a carrier that has a first conductive layer on a first side and a second conductive layer on a second side. The carrier is positioned in the recess of the PCB. The second conductive layer of the carrier is electrically connected to the second conductive layer of the PCB in the recess. The apparatus further includes a semiconductor die that is attached flip-chip to the first side of the carrier and configured to receive electrical ground from the second conductive layer of the PCB by way of the carrier.

In one embodiment, the apparatus further comprises wires connecting between pads on the first conductive layer of the PCB to corresponding pads on the first conductive layer of the carrier. The semiconductor die can be a high frequency radio frequency (RF) die and the wires can carry RF signals.

In one embodiment, the semiconductor die is a silicon-on-insulator (SOI) die and the carrier is attached to the PCB by an epoxy that is both thermally and electrically conductive.

In one embodiment, the second conductive layer of the PCB comprises a ground plane.

In one embodiment, the carrier comprises a laminated substrate, a ceramic substrate, or a semiconductor substrate. The semiconductor substrate may not include any electronic components or semiconductor devices fabricated thereon. The semiconductor substrate may comprise electronic components and semiconductor device elements.

In one embodiment, the first conductive layer comprises traces and wire bonding pads.

In one aspect, a package is disclosed. The package includes a means for carrying a semiconductor die by way of flip chip mounting. The carrying means comprises a first conductive layer on a first side and a second conductive layer on a second side opposite the first side. The first conductive layer comprises wire bonding pads.

In one embodiment, the carrying means comprises vias from the first side to the second side, the vias receive electrical ground from the second conductive layer, and the first conductive layer comprises traces electrically connecting the semiconductor die and the wire bonding pads.

BRIEF DESCRIPTION OF THE DRAWINGS

Specific implementations of the invention will now be described with reference to the following drawings, which are provided by way of example, and not limitation.

FIG. 3A shows a schematic side cross sectional view of a semiconductor package of FIG. 2 with a mold material.

FIG. 3B shows a schematic side cross sectional view of the semiconductor package without the mold material shown in FIGS. 2 and 3A.

DETAILED DESCRIPTION

Various embodiments disclosed herein relate to semiconductor packages. For example, the embodiments disclosed herein can be particularly beneficial for packaging radio frequency (RF) dies or chips. However, it should be understood that the embodiments disclosed herein are also beneficial for any other types of semiconductor dies.

A semiconductor die or chip includes an active side that can have active semiconductor components, such as transistors, fabricated therein. The active side can also include bond pads that may serve as an interface between the semiconductor die and external circuitry and components. For example, the bond pads can include input and/or output pads for sending and/or receiving signals, power pads for receiving power supply voltage(s), and/or ground pads for connecting to ground. Although various examples of bond pads have been described, a semiconductor die can include bond pads for serving a wide variety of functions. After fabrication, a semiconductor die can be packaged to aid in connecting the die to a larger electronic system, such as a printed circuit board (PCB).

Figure 1:
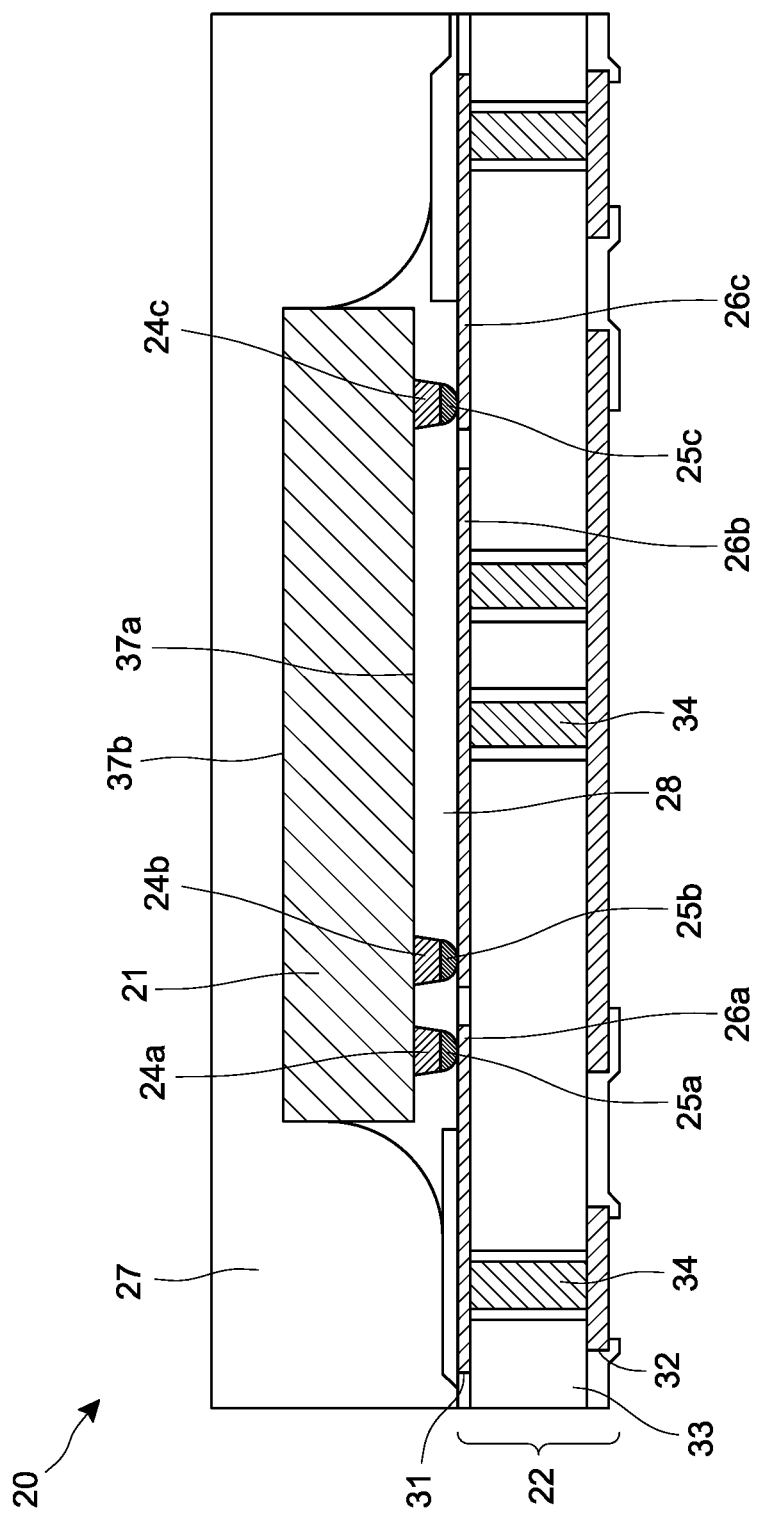
FIG. 1 is a schematic side sectional view of a packaged flip-chip component, according to one embodiment.

FIG. 1 is a schematic side sectional view of a packaged flip-chip component 20 that includes a semiconductor die 21, a package carrier 22 (e.g., laminate), conductive (e.g., copper) pillars 24a-24c, solder bumps 25a-25c, and a mold material (e.g., encapsulation 27 and underfill 28). The package carrier 22 includes a first conductive layer 31, a second conductive layer 32, and dielectric 33. Additionally, wiring patterns and pads 26a-26c can be formed from the first conductive layer 31. As shown in FIG. 1, laminate vias 34 connect portions of the first conductive layer 31 to portions of the second conductive layer 32. In the illustrated embodiment, the laminate vias 34 comprise through-carrier vias. In other embodiments, the carrier may include multiple intermediate wiring layers. The semiconductor die 21 includes an active side 37a including devices (e.g., transistors) and metallization and a back side 37b.

The packaged flip-chip component 20 can be attached to a board, such as a printed circuit board (PCB) (not shown in FIG. 1), with pads on the second conductive layer 32 connecting to corresponding pads on the PCB.

Figure 2:
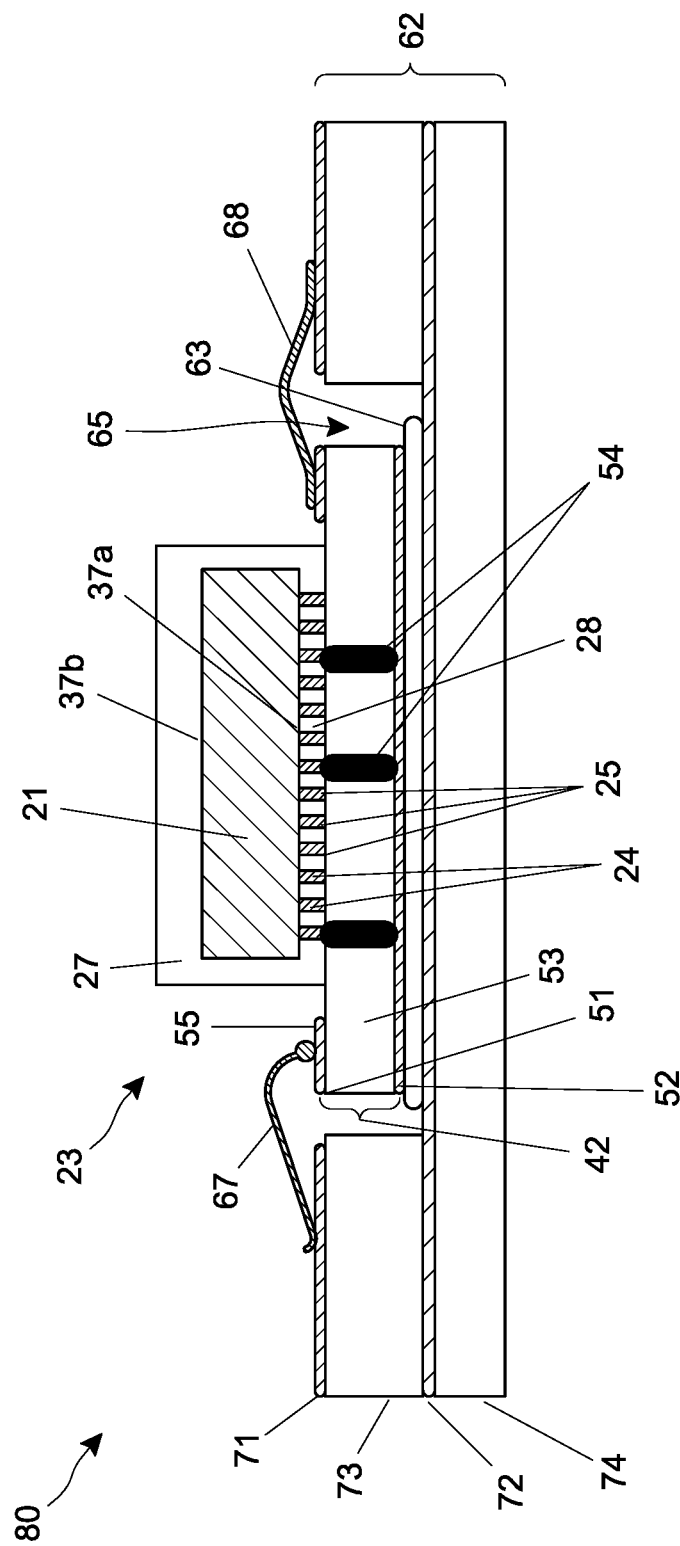
FIG. 2 is a schematic side sectional view of a packaged apparatus, according to one embodiment.

FIG. 2 is a schematic diagram of a packaged apparatus 80 that includes a semiconductor package 23 and a system board (e.g., a printed circuit board (PCB) 62). The package 23 comprises a flip-chip die 21 that is attached to a carrier 42. In use, for example, the package 23 can be disposed in a recess 65 of the printed circuit board 62, leaving an upper surface of the carrier 42 approximately flush with an upper surface of the PCB 62, as shown. In other embodiments, the upper surface of the carrier 42 can be recessed relative to the upper surface of the PCB 62, or may protrude above the upper surface of the PCB 62. The package 23 illustrated in FIG. 2 also includes a mold material (e.g., encapsulation 27 and underfill 28) about the flip-chip die 21. In some embodiments, for example, the encapsulation 27 and the underfill 28 may be provided in a multi-step process. First, the semiconductor die 21 with the pillars 24 and the solder bumps 25 can be reflowed onto the carrier 42. The underfill 28 can be disposed under and/or around the die 21. Then, the encapsulation 27 can be disposed over and/or around the die 21 and the underfill 28.

The PCB 62 includes a first conductive layer 71, a second conductive layer 72, dielectric layers 73, 74, and vias (not shown in FIG. 2). The PCB 62 of the illustrated embodiment further includes the recess 65, in which the carrier 42 has been attached using a thermally and/or electrically conductive epoxy 63. In some embodiments, the carrier 42 may be partially or fully disposed in the recess 65.

The carrier 42 includes a first conductive layer 51, a second conductive layer 52, dielectric 53, and vias 54 for connecting between portions of the conductive layers 51, 52.

The first conductive layer 51 can comprise pads 55. The pads 55 can be configured to receive a wire for wire bonding, e.g., for wire bonding to corresponding pads of the PCB 62. In some embodiments, the conductive layer 51 can also comprise traces (not shown) configured to interconnect metallic layers within the carrier 42. The pillars 24 and the traces can make electrical connections between the pads 55 and the die 21. The carrier 42 is electrically and/or thermally connected to the ground plane 72 of the PCB 62 by way of the epoxy 63. The vias 54 can be beneficial for providing a relatively low resistance/low inductance connection between the ground pads of the die 21 and the ground plane 72 of the PCB 62.

The first conductive layer 71 of the PCB 62 and the pads 55 of the carrier 42 can be used to carry RF signals, e.g., electromagnetic radiation at frequencies in a range of 10 GHz to 20 GHz. As shown in FIG. 2, the first conductive layer 71 of the PCB 62 includes traces and pads used for connecting wires (for instance, wire bonds 67 and/or wire ribbons 68) to corresponding traces and pads 55 of the carrier 42. In some embodiments, having shorter connecting wires may be beneficial as longer wires can cause more noise. The recess 65 can allow the pads 55 to be closer to the first conductive layer 71, which can make the connecting wires shorter than without the recess. The second conductive layer 72 can be connected to ground and need not include any signal traces. Therefore, the second conductive layer 72 can also be referred to as a ground plane, in some embodiments.

In some embodiments, the carrier 42 can comprise a carrying means for carrying the semiconductor die 21. In some embodiments, the carrier 42 can comprise a laminate substrate. In some embodiments, the carrier 42 can comprise a ceramic substrate. In some embodiments, the carrier 42 can comprise a semiconductor substrate, such as, for example, a gallium arsenide (GaAs) substrate, that does not include any active components. In some embodiments, the carrier 42 can comprise a semiconductor substrate, such as a GaAs substrate, that includes activate components (for example, transistors), formed on the same side of the carrier 42 as the first conductive layer 52. In such embodiments, a stacked die assembly can be provided. In some embodiments, GaAs can be beneficial because it was found to result in relatively low mechanical stresses to the pillars 24 across changes in temperature.

The die 21 can be fabricated in various processes. In some embodiments, the die 21 comprises a silicon-on-insulator (SOI) die. An advantage of the embodiment of FIG. 2 is that it allows SOI dies to be used in high performance RF applications (e.g., high RF power and/or high frequency). A range of high frequency can be, for example, 10 GHz to 20 GHz. For example, since a typical SOI fabrication process lacks through substrate vias (TSVs), it is difficult to use SOI dies in certain high performance RF applications, a robust ground connection is not readily available. In contrast, GaAs dies can be integrated into RF applications more easily than the SOI dies because a robust ground can be provided by way of TSVs available in GaAs fabrication processes. Thus, GaAs and/or any other similar processes have been conventionally used for high performance RF applications. Although SOI dies can be attached flip-chip, using a convention configuration, it still does not provide a sufficient ground. However, the embodiment of FIG. 2 can be suitable for providing a robust ground connection to an SOI die, and thus allows SOI dies to be used in high performance RF applications.

FIG. 3A shows a side cross sectional view of the semiconductor package 23 of FIG. 2 with the mold material (e.g., encapsulation 27 and underfill 28) disposed about the die 21. FIG. 3B shows a side cross sectional view of the semiconductor package 23 without the mold material 27, 28 shown in FIGS. 2 and 3A. In some embodiments, the dielectric 53 can comprise a laminate substrate as shown in FIG. 3A and/or a ceramic substrate as shown in FIG. 3B. The mold material 27, 28 can be provided for matching thermal constants of the die 21 and the dielectric 53. It can be beneficial to have a material for the dielectric 53 that has a similar coefficient of thermal expansion (CTE) as the die 21 so that the mold material can be minimized or omitted. It can be beneficial because such embodiments without the mold material allow the back side 37b (e.g., an active side) of the die 21 to be exposed to air, which can provide a relatively high RF performance due to lower dielectric loss than with the molding material, such as the encapsulation 27. Also, it can be beneficial because the overall dimension of the package 23 can be smaller than embodiments that include the mold material, such as the encapsulation 27. For example, the lateral dimension of the embodiment of FIG. 3B can be about 0.5 mm (e.g., 0.4 mm to 0.6 mm) smaller than the embodiment of FIG. 3A with the mold material, in some embodiments. In some embodiments, the embodiments of FIG. 3B can include at least a portion of the underfill 28 that is shown in FIG. 3A but may omit the encapsulation 27. In some other embodiments, the semiconductor package 23 may include at least a portion of the underfill 28 and/or at least a portion of the encapsulation 27.

Figure 4:
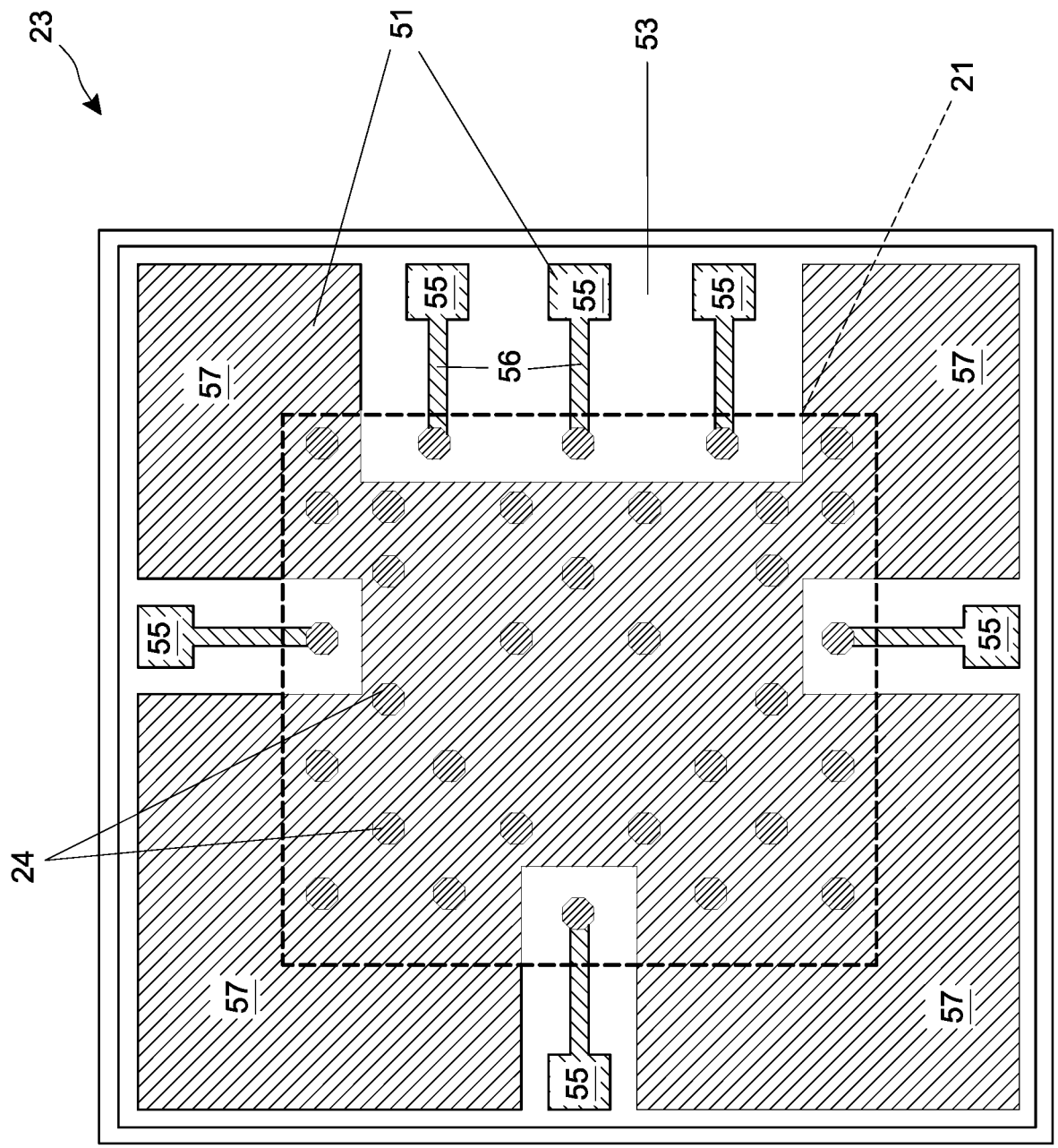
FIG. 4 is a top plan view of the semiconductor package of FIG. 3B with a die being hidden to show pillars.

FIG. 4 is a top plan view of the package 23 of FIG. 3B with the die 21 being hidden to show elements underneath the die 21. The conductive layer 51 on the dielectric 53 can comprise the pads 55. The pads 55 can be configured to electrically connect with a wire (e.g., bond wire, ribbon wire, etc.) for providing an electrical connection to active components of the die 21. The conductive layer 51 can also comprise traces 56, which can comprise interconnects that electrically connect various active components of the die 21. The pillars 24 and the traces 56 can make electrical connections between the pads 55 and the die 21. The pads 55 can be used to carry RF signals, in some embodiments. In some embodiments, portions 57 of the first conductive layer 51 can distribute ground connections from the die 21 to a wider area on the dielectric 53.

Figure 5:
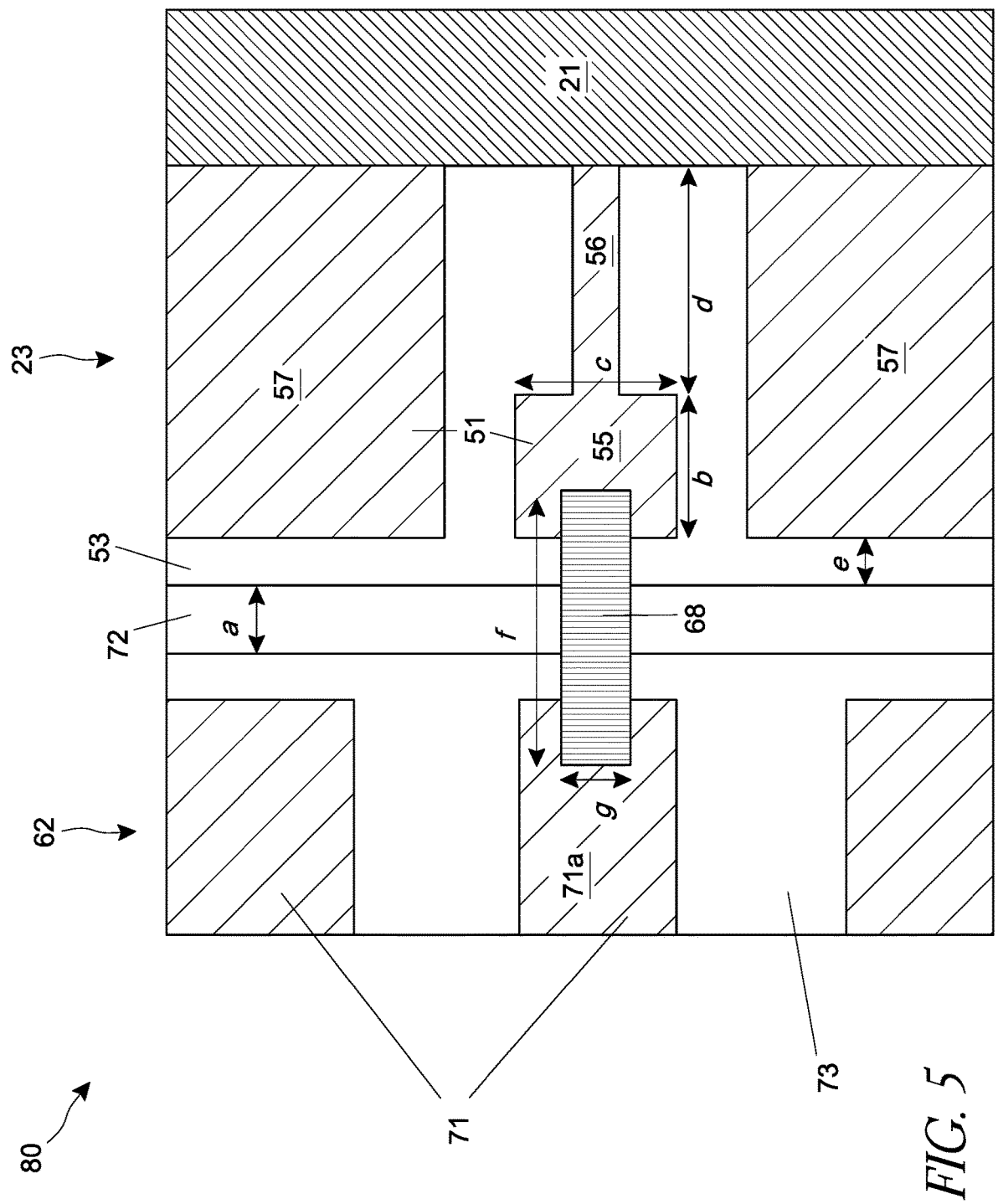
FIG. 5 is a top plan view of a portion of the packaged apparatus showing a connection between a printed circuit board (PCB) and the semiconductor package, according to various embodiments.

FIG. 5 is a top plan view of a portion of the packaged apparatus 80 according to various embodiments. The portion of the package apparatus 80 in FIG. 5 shows the electrical connection between the pad 55 and a portion 71a of the first conductive layer 71 of the PCB 62 by a ribbon wire 68. However, in some embodiments, the pad 55 and the portion of the first layer of the PCB 62 can be bonded by any suitable bonding methods (e.g., by thinner bonding wires, such as gold bonding wires).

The package apparatus 80 can have a lateral gap a between the semiconductor package 23 and a first dielectric layer 73 of the PCB 62. In some embodiments, the gap a can be in a range of, for example, 2 mm to 3 mm. The lateral gap a can assist disposing the semiconductor package 23 into the recess formed in the PCB 62. In some embodiments, the gap a can receive an excess amount of the epoxy 63 (see, for example, FIG. 2) that connects the semiconductor package 23 and the second conductive layer 72, which may, for example, prevent the epoxy 63 from reaching the upper surface of the carrier 42 and/or the upper surface of the PCB 62.

In some embodiments, the pad 55 can have comprise a rectangular shape as shown in FIG. 5. However, it should be appreciated that the shape of the pad can vary. The pad 55 of FIG. 5 can have dimensions b and c representative of two sides of the pad 55. The dimension b can be about, for example, 155 µm (e.g., 145 µm to 165 µm) and the dimension c can be about, for example, 175 µm (e.g., 165 µm to 185 µm), in some embodiments.

The trace 56 can comprise a dimension d from an edge of the die 21 to the pad 55. The dimension d can be about, for example, 250 µm (e.g., 240 µm to 260 µm), in some embodiments. It should be understood that the dimension d may vary based at least in part on, for example, a size of the die 21 relative to the carrier 42 (see, for example FIG. 2) and/or the dimensions b and c of the pad 55.

In some embodiments, the conductive layer 51 of the carrier 42 can be smaller in a lateral dimension than the carrier leaving an uncovered portion of the dielectric 53 around edges of the carrier 42. The uncovered portion of the dielectric 53 can have a dimension e from an edge of the carrier to an edge of the conductive layer 51. The dimension e can be about, for example, 50 µm (e.g., 45 µm to 55 µm). Such uncovered portion can be beneficial when singulating (e.g., sawing) the semiconductor package 23. In some embodiments, sawing through the conductive layer 51 may cause, for example, creation of metal residues, which in turn may result an electrical shorting. Therefore, the uncovered portion can provide a singulation street for singulating the semiconductor package 23.

The ribbon 68 can have a length f and a width g. The length f of the ribbon 68 can be in a range of, for example, 10 mm to 12 mm. It should be understood that the length f of the ribbon 68 may vary based at least in part on, for example, the gap a and the dimension e, a thickness of the carrier 42, and/or a thickness of the recess 65. The width g of the ribbon 68 can be in a range of, for example, 2 mm to 3 mm.

Figure 6:
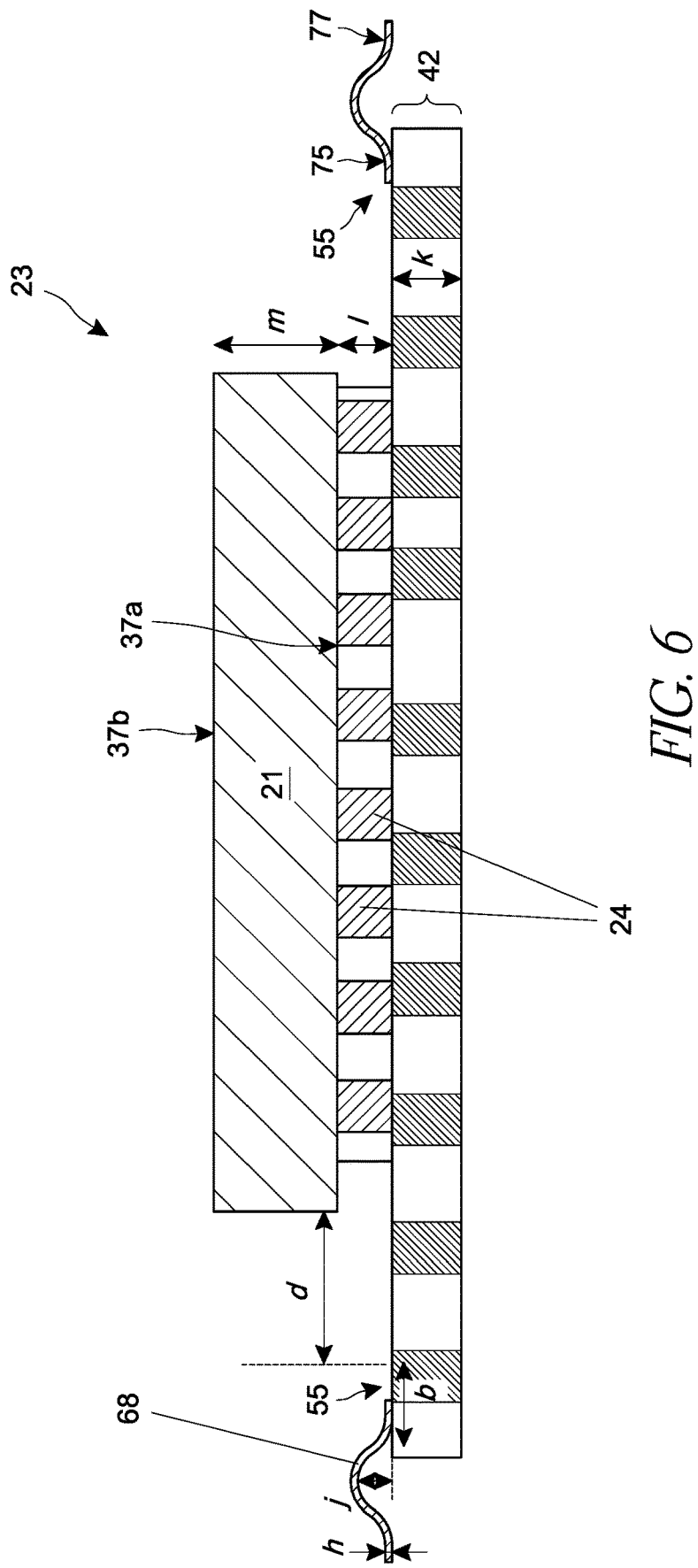
FIG. 6 is a schematic side sectional view of the semiconductor package with ribbons attached to a carrier, according to various embodiments.

FIG. 6 is a side sectional view of the semiconductor package 23 with ribbons 68 attached to the carrier 42. The ribbon 68 has first and second ends 75, 77. The embodiment illustrated in FIG. 6 assumes that the second end 77 of the ribbon 68 is connected to a corresponding pad on the PCB that is at the same relative height as the pad 55 that receives the first end 75 of the ribbon 68 (see, for example, FIG. 2). The ribbon 68 can include a ribbon thickness h. The ribbon thickness can be in a range of, for example, 0.012 mm to 0.051 mm. The ribbon has a height j measured from an upper surface of the carrier 42 to the highest point of a ribbon arch. The height j can be in a range of, for example, 3 mm to 5 mm.

The carrier 42 can have a carrier thickness k measured vertically from a lower surface of the carrier 42 to the upper surface of the carrier 42. The thickness k can be in a range of, for example, 4 mm to 5 mm.

The pillar 24 can have a height l measured from the upper surface of the carrier 42 to the active side 37a of the die 21. The die can have a thickness m measured vertically from the active side 37a to the back side 37b of the die. A sum of the height l and the thickness m can be in a range of, for example, 12 mm to 13 mm.

Figure 7:
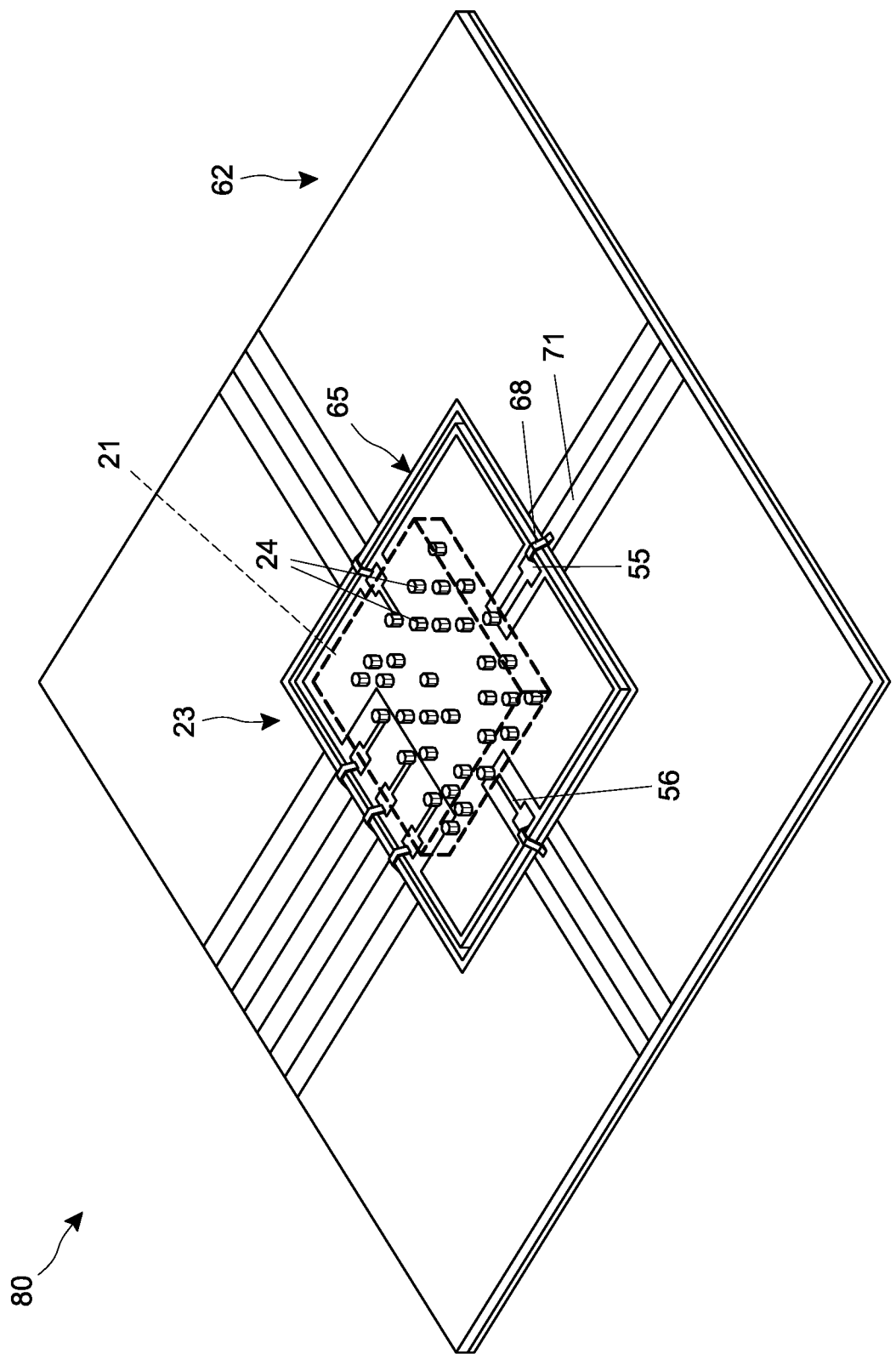
FIG. 7 is a top perspective view of the packaged apparatus of FIG. 2 with the die shown in hidden lines to illustrate the pillars.
Figure 8:
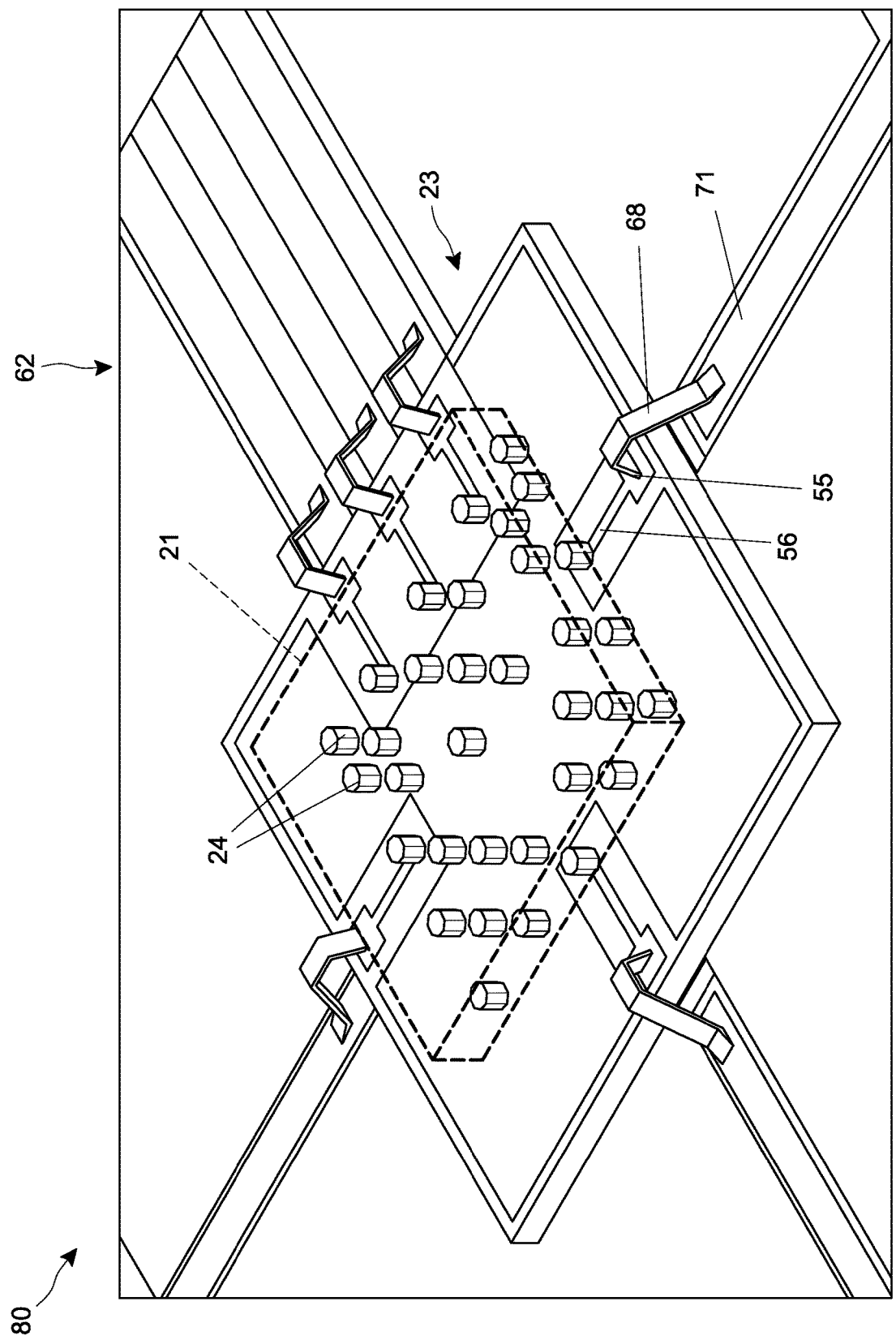
FIG. 8 is a top perspective view of the package apparatus that does not include a recess that is shown in FIG. 7.

FIG. 7 is a top perspective view of the packaged apparatus 80 of FIG. 2 with the die 21 shown in hidden lines to better illustrate the pillars 24. FIG. 8 is a top perspective view of the package apparatus 80 that does not include the recess 65 that is shown in FIG. 7. The package 80 includes the semiconductor package 23 disposed in the recess 65 of the PCB 62 in FIG. 7. In FIG. 8, ribbons 68 that are longer than the ribbons 68 used with the embodiments shown in FIG. 7 are used to compensate for a height difference that is made by the lack of recess 65. The pads 55 of the package 23 and portions of the conductive layer 71 of the PCB 62 are electrically connected by the ribbons 68. It should be appreciated that the connection can be also provided by way of wire bonding or any other suitable means.

Although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. A package comprising:
   a carrier comprising a first conductive layer on a first exterior side and a second conductive layer on a second exterior side opposite the first exterior side, wherein the carrier comprises a ceramic substrate or a semiconductor substrate, and the first conductive layer comprises a first portion having wire bonding pads configured to electrically connect the package with an external substrate or device;
   a semiconductor die flip-chip mounted on the first exterior side of the carrier, a trace of the first conductive layer extending continuously on the first exterior side of the carrier from a first wire bonding pad of the wire bonding pads to the semiconductor die; and
   a conductive pillar between the semiconductor die and the carrier, a first portion of the conductive pillar extends from a surface of the carrier and a second portion of the conductive pillar extends from a surface of the semiconductor die,
   wherein the carrier comprises an electrical ground via electrically connecting the semiconductor die and the second conductive layer, the first conductive layer comprises a second portion configured to distribute ground connections from the semiconductor die to an area on the first exterior side of the carrier wider than an area of the semiconductor die, and the semiconductor die is positioned at least partially over the second portion of the first conductive layer.

2. The package of claim 1, wherein the carrier comprises a single layer substrate, and the electrical ground via extends from the first exterior side to the second exterior side and receives electrical ground from the second conductive layer.

3. The package of claim 1, wherein the semiconductor die is a high frequency radio frequency (RF) die and the first conductive layer carries RF signals.

4. The package of claim 1, wherein the semiconductor die is a silicon-on-insulator (SOI) die.

5. The package of claim 1, further comprising copper pillars between the semiconductor die and the carrier, wherein the conductive pillar is one of the copper pillars.

6. The package of claim 1, further comprising molding material disposed around the semiconductor die.

7. The package of claim 1, wherein the carrier comprises a gallium arsenide (GaAs) substrate.

8. The package of claim 1, wherein the carrier comprises the semiconductor substrate, and the semiconductor substrate does not include an electronic component or semiconductor device fabricated thereon other than the semiconductor die.

9. The package of claim 1, wherein the carrier comprises the semiconductor substrate, and the semiconductor substrate comprises electronic components and semiconductor device elements.

10. The package of claim 3, wherein the RF signals include one or more frequencies in a range of 10 GHz to 20 GHz.

11. A package comprising:
    a carrier having an exterior top side and an exterior bottom side opposite the exterior top side, the carrier comprising a first conductive layer on the exterior top side and a second conductive layer on the exterior bottom side opposite the exterior top side, wherein the first conductive layer comprises wire bonding pads and a ground distribution portion, and the second conductive layer comprises a ground plane having a surface configured to connect to a system board by way of an adhesive;
    a semiconductor die flip-chip mounted on the exterior top side of the carrier, the ground distribution portion configured to distribute ground connections from the semiconductor die to an area on the exterior top side wider than an area of the semiconductor die, and a trace of the first conductive layer extending continuously on the exterior top side of the carrier from a first wire bonding pad of the wire bonding pads to the semiconductor die;
    an electrical ground via extending through the carrier from the exterior top side to the exterior bottom side, the electrical ground via electrically connecting the semiconductor die and the ground plane; and
    a conductive pillar between the semiconductor die and the carrier, a first portion of the conductive pillar extends from a surface of the carrier and a second portion of the conductive pillar extends from a surface of the semiconductor die.

12. The package of claim 11, wherein the carrier comprises a ceramic substrate or a semiconductor substrate.

13. The package of claim 11, wherein the conductive pillar comprises a copper pillar.

* * * * *